United States Patent
Wang et al.

(10) Patent No.: US 10,411,924 B2
(45) Date of Patent: *Sep. 10, 2019

(54) AUTOMATIC GAIN COMPRESSION DETECTION AND GAIN CONTROL FOR ANALOG FRONT-END WITH NONLINEAR DISTORTION

(71) Applicant: Maxlinear Asia Singapore PTE Ltd., Singapore (SG)

(72) Inventors: Nanyan Wang, Coquitlam (CA); Timothy Lupick, Calgary (CA)

(73) Assignee: MAXLINEAR ASIA SINGAPORE PTE LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/445,102

(22) Filed: Feb. 28, 2017

(65) Prior Publication Data
US 2017/0207937 A1    Jul. 20, 2017

Related U.S. Application Data

(63) Continuation of application No. 14/662,845, filed on Mar. 19, 2015, now Pat. No. 9,582,018.

(51) Int. Cl.
*H04B 7/00* (2006.01)
*H04L 27/00* (2006.01)
(Continued)

(52) U.S. Cl.
CPC .......... *H04L 27/0002* (2013.01); *G05F 1/625* (2013.01); *H03F 1/32* (2013.01);
(Continued)

(58) Field of Classification Search
CPC ........ H04B 1/109; H04B 1/1027; H04B 1/10; H04B 17/318; H04B 1/1036;
(Continued)

(56) References Cited

U.S. PATENT DOCUMENTS 6,230,031 B1 * 5/2001 Barber .................. H01Q 1/242
                                                     455/127.3
6,625,433 B1 * 9/2003 Poirier ................. H03G 3/3068
                                                     455/232.1

(Continued)

*Primary Examiner* — Linh V Nguyen
(74) *Attorney, Agent, or Firm* — McAndrews, Held & Malloy, Ltd.

(57) ABSTRACT

Methods and systems are provided for gain control in circuits. Gain applied in a circuit may be set to a baseline set gain. A first baseline parameter, associated with a first feature of a particular pattern of a signal at said baseline set gain, and a second baseline parameter, associated with a second feature of said particular pattern of the signal at said baseline set gain, may be determined. The gain is then set a current set gain, and a gain compression ratio may be determined based on one or more of said first baseline parameter, said second baseline parameter, a first current parameter associated with said first feature of at said current set gain, and a second current parameter associated with said second feature at said current set gain. Said current set gain may then be adjusted until said gain compression ratio reaches a predefined limit.

20 Claims, 10 Drawing Sheets

(51) Int. Cl.
  *G05F 1/625* (2006.01)
  *H03F 1/32* (2006.01)
  *H03G 3/20* (2006.01)
  *H04B 1/00* (2006.01)
  *H04L 5/00* (2006.01)
  *H03G 3/30* (2006.01)
  *H03G 7/00* (2006.01)
  *H03G 7/06* (2006.01)
  *H04B 1/10* (2006.01)

(52) U.S. Cl.
  CPC ............ *H03G 3/20* (2013.01); *H03G 3/3052* (2013.01); *H03G 7/00* (2013.01); *H03G 7/06* (2013.01); *H04B 1/0007* (2013.01); *H04L 5/006* (2013.01); *H03G 2201/206* (2013.01); *H04B 1/10* (2013.01); *H04B 1/1027* (2013.01)

(58) Field of Classification Search
  CPC  H04B 2001/0433; H04B 17/13; H04B 17/21; H04B 17/309; H04B 1/0475; H04B 2001/0416; H04B 2201/70707
  USPC  ........... 341/139, 140, 142; 455/232.1, 245.1, 455/234.1, 240.1, 253.2, 234.2, 126
  See application file for complete search history.

(56) References Cited

U.S. PATENT DOCUMENTS

| | | |
|---|---|---|
| 7,110,724 B1 | 9/2006 | Epperson et al. |
| 7,321,324 B2 * | 1/2008 | Piovaccari ............ H03M 3/442 341/139 |
| 7,460,589 B2 | 12/2008 | Fujimori et al. |
| 7,738,605 B2 | 6/2010 | Mobin et al. |
| 8,364,033 B2 | 1/2013 | Skoog et al. |
| 8,620,233 B2 | 12/2013 | Brobston |
| 9,582,018 B1 * | 2/2017 | Wang ...................... G05F 1/625 |
| 2002/0142745 A1 * | 10/2002 | Kang ................... H03G 3/3068 455/232.1 |
| 2005/0032487 A1 * | 2/2005 | Montalvo ............ H03G 3/3047 455/126 |
| 2006/0030352 A1 * | 2/2006 | Kiran .................... H04W 52/08 455/522 |
| 2007/0098118 A1 * | 5/2007 | Muhammad ........... H04B 1/123 375/344 |
| 2007/0243843 A1 | 10/2007 | Shalash |
| 2008/0242249 A1 * | 10/2008 | Gomez ................ H03G 1/0088 455/234.1 |
| 2009/0058531 A1 | 3/2009 | Hwang et al. |
| 2009/0061809 A1 * | 3/2009 | Muhammad ......... H03G 3/3068 455/313 |
| 2010/0142661 A1 * | 6/2010 | Lee ...................... H03G 3/3052 375/345 |
| 2010/0220821 A1 * | 9/2010 | Vrcelj .................. H04B 1/1036 375/345 |
| 2011/0069794 A1 * | 3/2011 | Tavassoli Kilani ......................... H04L 25/0274 375/346 |
| 2012/0004005 A1 | 1/2012 | Ahmed et al. |
| 2012/0113335 A1 * | 5/2012 | Rotzoll ................ H04N 13/398 349/13 |
| 2014/0241456 A1 * | 8/2014 | Yanagisawa ............. H04B 1/10 375/285 |

* cited by examiner

AUTOMATIC GAIN COMPRESSION DETECTION AND GAIN CONTROL FOR ANALOG FRONT-END WITH NONLINEAR DISTORTION

CLAIM OF PRIORITY

This patent application is a continuation of U.S. patent application Ser. No. 14/662,845, filed on Mar. 19, 2015, which is hereby incorporated herein by reference in its entirety.

FIELD

The present disclosure relates to gain compression in variable gain analog front end receivers.

BACKGROUND

Analog front-end (AFE) circuits are widely used in various electronic signal processing applications to provide signal conditioning for sensors and other circuits. For example, An AFE is often used for conditioning an analog signal encoding digital data for receipt and conversion by an analog-to-digital converter (ADC).

A simple AFE circuit 100 with variable gain for converting an analog signal into a digital signal is shown in FIG. 1. The AFE circuit 100 comprises a variable gain amplifier (VGA) block 110, a signal conditioning block 120, and an ADC block 130. A received analog signal 140 is first adjusted in amplitude by the VGA block 110 based on a gain control signal 150 either to increase (amplify) or decrease (attenuate) the analog signal 140 amplitude depending on the received signal characteristics and the desired signal amplitude in the following analog blocks. The amplitude-adjusted analog signal 160 is then received by the signal conditioning block 120 which conditions the amplitude-adjusted analog signal 160, for example by filtering noise, mitigating inter-symbol interference, compensating direct current (DC) offset, and improving signal integrity of the received signal. The signal conditioning block 120 may include one or more blocks, each of which may have nonlinear effects on the signal 160 and may amplify or attenuate the signal 160. The conditioned analog signal 170 is received by the ADC 130 which converts the conditioned analog signal 170 into a digital signal 180. Usually the calculated signal level at the output of the ADC 130 is used to set the gain control signal 150 of the VGA 110 so that the output signal level meets certain criteria.

One challenge faced in the design and implementation of an AFE circuit is gain compression which is illustrated in FIG. 2. As shown in FIG. 2, an ideal amplifier will be characterized by a linear relationship between an input voltage and an output voltage over all values of the input voltage. The ideal amplifier is thus said to be characterized by a linear gain. A practical amplifier, however, is typically characterized by nonlinear gain above some threshold amplitude which depends upon numerous factors including the characteristics of the amplifier circuitry and the environment of the circuit. Above the threshold input voltage, which may be termed a 'nonlinear range', further increases in input voltage do not result in proportional increases in output voltage, but rather typically result in smaller increases than produced below the threshold voltage in a 'linear range'. Thus, above the threshold voltage, the gain of the amplifier is said to be 'compressed'.

Gain compression is a challenge in the design and implementation of AFE circuits as the analog elements of an AFE circuit are typically characterized by nonlinear gain above a threshold signal amplitude (and thus, voltage). A received analog signal will typically include portions with relatively higher and lower instantaneous amplitude, for example the peaks and valleys, respectively, of a carrier wave. Depending upon the gain of the VGA block, the peaks of the signal may be made to fall within the nonlinear range of the signal conditioning block, while the valleys remain in the linear range. Due to gain compression, the peaks, and any other portion of the signal above the threshold amplitude, do not increase in amplitude as much as the valleys of the signal and any other portion below the threshold amplitude, thus causing distortion of the signal received by the ADC block. In order words, the impact of gain compression is that the signal received by the ADC block is distorted by the nonlinear gain of analog elements of the AFE circuit, and the signal level received by the ADC block is not as expected. These effects cause an increased amount of error after converting the analog signal into a digital representation which in turn results in a degradation of overall system performance.

There are several challenges compensating for analog nonlinearity and AFE gain control. One challenge is that the observed signal level at the output of the ADC does not indicate whether nonlinear effects are being produced in the system. Consequently, increasing the gain in order to reduce the ADC sampling error may actually increase the sampling error due to the degradation of the signal from nonlinear effects. Another challenge is that the actual gain produced by the VGA typically varies from device to device due to silicon process variations and also varying device operating conditions such as voltage and temperature, which makes direct calculation of the actual gain of the VGA impractical, which in turn makes impractical direct calculation of the gain compression in the circuit using only the observed output signal level of the ADC.

One typical approach to gain control of a nonlinear amplifier is to measure the output voltage and increase the gain until a target output voltage level is reached. A disadvantage of this approach is that it does not take gain compression of the amplifier into account and as such severe signal degradation can occur.

A variant of the above typical approach is to select the target output voltage level based on a determination of a typical linear range of the AFE circuit. Such approach does not take into account, however, the fact that that the actual gain characteristics and nonlinear range of AFE circuits change over silicon process variations and operating conditions such as temperature and voltage. Using a predetermined target amplitude can nevertheless result in severe signal distortion due to varying process and operating conditions.

Another issue is that a typical signal conditioning circuit may include multiple stages of elements which include additional gain controls and are characterized by nonlinear gain when the input signal from a preceding stage is too high. It is problematic and impractical to allocate gains to these stages without visibility of the compression of the signal causing a stage to be overdriven by the preceding stage resulting in signal distortion.

In view of the above disadvantages, typical AFE circuits are designed to minimize gain compression by limiting the VGA gain so as to ensure that the amplitude of the amplitude-adjusted analog signal falls within the linear region of the conditioning circuit block. Lacking an accurate knowledge of the gain characteristics of the conditioning circuit block, and in order to compensate for variations in the gain due to process variations and operating conditions however, and in order to ensure that the complete dynamic range of the signal can be compensated, the resulting conditioned analog signal is typically below a level which provides an optimum signal-to-noise ratio (SNR) at the ADC block. The result is a degradation of the system performance due to non-optimal receiver gain.

In other words, in a conventional AFE design, the linear gain range of an amplifier is often over-designed in order to minimize the compression effects in the receiver with the disadvantageous result of increased power consumption and amplifier design complexity.

There is thus material value in techniques which address, compensate, or provide a solution to the problem of, gain compression in AFE circuits.

SUMMARY

The techniques disclosed herein provide material values which may include addressing, compensating, or otherwise providing a solution to the problem of, gain compression in AFE circuits.

The techniques provide gain compression detection and automatic gain control for an AFE receiver to minimize nonlinear distortion of an analog signal. The gain compression ratio is detected by monitoring a relative amplitude difference between a measured inner eye and an outer eye of a conditioned analog signal across a range of AFE circuit gains. Based on the detected compression ratio, an analog gain control adjusts a gain of the AFE circuit to amplify an incoming signal so as to maintain a gain compression of the signal within a predefined limit and to improve a signal-to-noise ratio at an AFE circuit output.

A method of controlling a gain of an AFE circuit may include the following steps. The gain may be set to a baseline set gain. An inner eye baseline amplitude of an inner eye of an eye pattern of a signal may be determined at the baseline set gain, and an outer eye baseline amplitude of an outer eye of the eye pattern of the signal may be determined at the baseline set gain. The gain may be set to a current set gain higher than the baseline set gain. A gain compression ratio may be determined based on the inner eye baseline amplitude, the outer eye baseline amplitude, an inner eye current amplitude of the inner eye of the eye pattern at the current set gain, and an outer eye current amplitude of the outer eye of the eye pattern at the current set gain. The current set gain may be increased until the gain compression ratio reaches a predefined limit.

Each one of the inner eye baseline amplitude, the outer eye baseline amplitude, the inner eye current amplitude, and the outer eye current amplitude may be a different amplitude, and each amplitude may be determined by determining each of a positive voltage and negative voltage of the amplitude by adjusting a corresponding threshold voltage until a proportion of samples of the signal in a sampling period exceeding the threshold voltage reaches a target proportion. The target proportion for the inner eye amplitude may be greater than the target proportion for the outer eye amplitude.

Each amplitude may be a median amplitude.

The gain compression ratio may be determined by: determining a compression-free estimate of the outer eye current amplitude without gain compression; and determining the gain compression ratio based on the compression-free estimate and the outer eye current amplitude. The gain compression ratio may be a quotient of the compression-free estimate of the outer eye current amplitude without gain compression and the outer eye current amplitude. The compression-free estimate of the outer eye current amplitude may be determined by: determining a compression-free gain response based on the inner eye current amplitude and the inner eye baseline amplitude; and determining the compression-free estimate of the outer eye current amplitude based on the compression-free gain response and the outer eye baseline amplitude. The compression-free gain response may be a quotient of the inner eye current amplitude and the inner eye baseline amplitude. The compression-free estimate of the outer eye current amplitude may be a product of the compression-free gain response and the outer eye baseline amplitude.

The baseline gain may be selected to produce the inner eye baseline amplitude and the outer eye baseline amplitude below a nonlinear gain threshold of the AFE circuit.

A gain control circuit may control a gain of an AFE circuit comprising at least one AFE stage to input an incoming analog signal and to generate a conditioned analog signal. The gain control circuit may have a first circuit, and a second circuit, and a third circuit. The first circuit may control a set gain of the at least one AFE stage to a baseline set gain or a current set gain higher than the baseline set gain. The second circuit may input the conditioned analog signal and determine an inner eye amplitude of an inner eye of a signal eye of the conditioned analog signal and an outer eye amplitude of an outer eye of the signal eye. The third circuit may be connected to the second circuit to determine a current gain compression of the conditioned analog signal based on: the inner eye amplitude at the baseline set gain and the outer eye amplitude at the baseline set gain, and the inner eye amplitude at the current set gain and the outer eye amplitude at the current set gain.

The first circuit may be responsive to the third circuit to increase the current set gain until the current gain compression reaches a predefined limit.

Each of the inner eye amplitude and the outer eye amplitude may include a positive and a negative voltage, and the second circuit may include: a fourth circuit to sample the conditioned analog signal based on a threshold voltage, and, to determine each of the positive voltage and negative voltage by adjusting the threshold voltage until a proportion of samples of the conditioned analog signal in a sampling period exceeding the threshold voltage reaches a target proportion based on a target count. The target proportion for the inner eye amplitude may be greater than the target proportion for the outer eye amplitude.

Each amplitude may be a median amplitude.

The third circuit may determine the gain compression ratio by: determining a compression-free estimate of the outer eye amplitude at the current set gain without gain compression; and determining the gain compression ratio based on the compression-free estimate and the outer eye amplitude at the current set gain. The gain compression ratio may be a quotient of the compression-free estimate of the outer eye amplitude at the current set gain without gain compression and the outer eye amplitude at the current set gain. The third circuit may determine the compression-free estimate of the outer eye amplitude at the current set gain by: determining a compression-free gain response based on the inner eye amplitude at the current set gain and the inner eye amplitude at the baseline set gain; and determining the compression-free estimate of the outer eye amplitude at the current set gain based on the compression-free gain response and the outer eye amplitude at the baseline set gain. The compression-free gain response may be a quotient of the inner eye amplitude at the current set gain and the inner eye amplitude at the baseline set gain. The compression-free estimate of the outer eye amplitude at the current set gain may be a product of the compression-free gain response and the outer eye amplitude at the baseline set gain.

The baseline set gain may produce the inner eye amplitude baseline and the outer eye baseline amplitude below a nonlinear gain threshold of the AFE stages.

An AFE circuit may include at least one AFE stage, a gain control block, a finite state machine (FSM) block, a sampler block, a threshold control block, and a compression calculation block. The at least one AFE stage may input an incoming analog signal and generate a conditioned analog signal. The gain control block may control a set gain of the at least one AFE stage. The FSM block may control the gain control block to set the set gain to a baseline set gain or a current set gain higher than the baseline set gain, and set target counts for determining an inner eye amplitude and an outer eye amplitude of a signal eye of the conditioned analog signal. The sampler block may sample the conditioned analog signal responsive to a threshold voltage. The threshold control block may be responsive to the FSM block to adjust the threshold voltage until a proportion of samples of the conditioned analog signal in a sampling period exceeding the threshold voltage reaches a target proportion based on one of the target counts received from the FSM block. The compression calculation block may be responsive to the threshold control block to determine a gain compression of the conditioned analog signal at the current signal gain based on threshold voltages received from the threshold control block. The FSM block may increase the current set gain until the gain compression ratio reaches a predefined limit.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

DETAILED DESCRIPTION

The techniques provide gain compression detection and automatic gain control for an AFE receiver to minimize nonlinear distortion of an analog signal. The techniques may be termed automatic compression detection and gain control (ACDGC).

AFE Circuit with ACDGC Block

Figure 1:
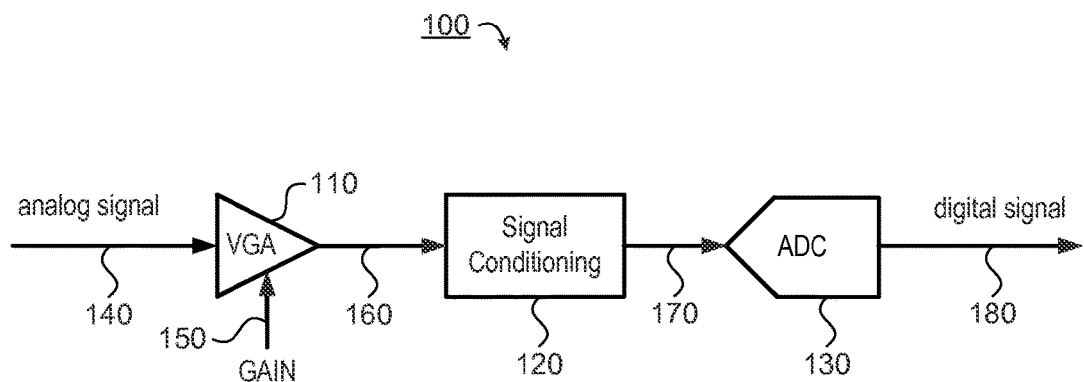
FIG. 1 is a block diagram of a known AFE circuit.
Figure 2:
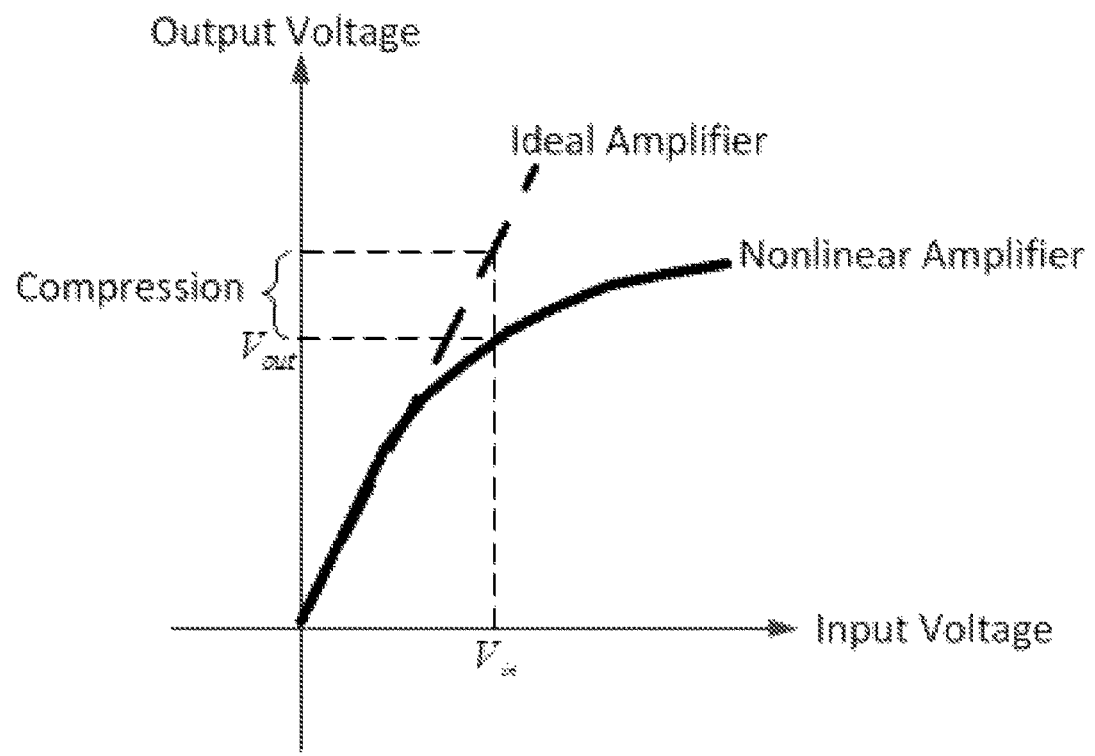
FIG. 2 is a chart illustrating gain compression.
Figure 3:
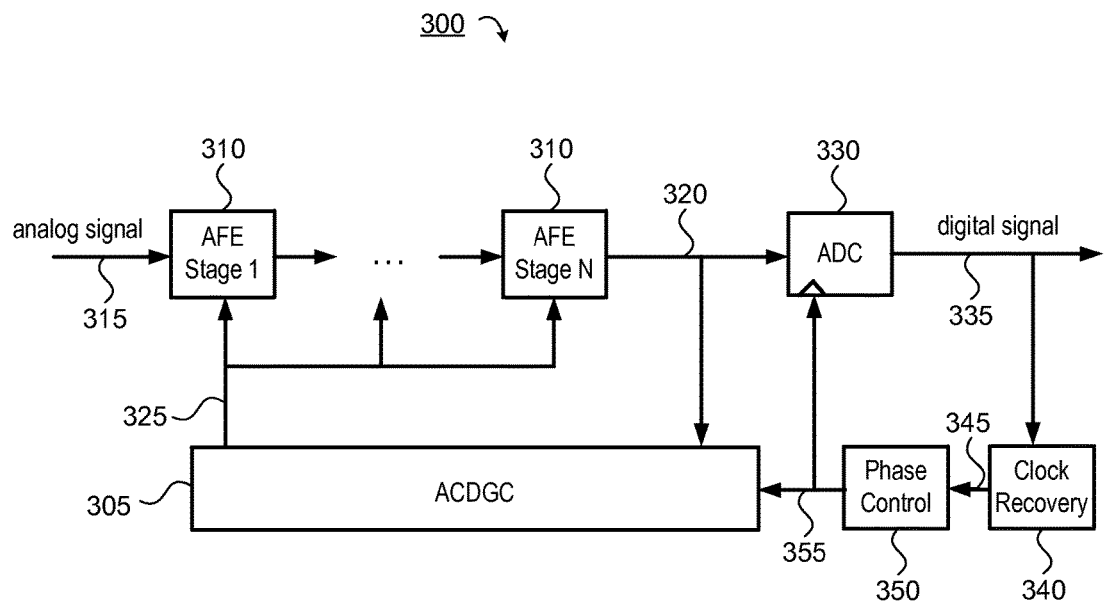
FIG. 3 is a block diagram of an AFE circuit having an automatic compression detection and gain control (ACDGC).

An AFE circuit 300 including an ACDGC block 305 is shown in FIG. 3.

The AFE circuit 300 comprises one or more AFE stages 310 connected in a sequential chain. The AFE stages 310 considered collectively may be termed the "AFE stages". Each AFE stage 310 in the chain modifies an analog signal as received from a preceding AFE stage 310, and outputs the modified analog signal to a next AFE stage 310 in the chain, hi other words: a first AFE stage receives an incoming analog signal 315, modifies the incoming analog signal 315, and outputs the modified analog signal; each subsequent AFE stage 310 in the chain receives an incoming modified analog signal from a preceding AFE stage 310 in the chain, further modifies the incoming modified analog signal, and outputs the further modified analog signal; and a last AFE stage 310 in the chain outputs the further modified analog signal, as modified by all of the AFE stages in the chain, as a conditioned analog signal 320. Each AFE stage 310 receives a gain control signal 325 from the ACDGC block 305, the gain control signal 325 including a set gain. Each AFE stage 310 is characterized by a gain response, such that a current gain of the AFE stage is related to the set gain by the gain response. For example, one or more of the AFE stages 310 may comprise a corresponding VGA. Each AFE stage 310 may also contain signal conditioning circuitry. The AFE stages 310 collectively are characterized by a collective gain response, which may be termed, simply, the gain response of the AFE stages when referenced collectively.

The conditioned analog signal 320 output by the last AFE stage 310 is received by an analog-to-digital converter (ADC) block 330 which generates an outgoing digital signal 335. A clock recovery block 340 may receive the digital signal 335 to recover a clock 345 encoded in the incoming analog signal 315, and to control a phase control block 350 which generates a phase signal 355 to control a phase of the analog-to-digital conversion by the ADC block 330, according to methods known in the art.

When amplifying an incoming signal 315 with one or more AFE stages 310, the set gain 325 of the AFE stages 310 may be adjusted until an average amplitude of the conditioned analog signal 320 equals a target amplitude. The target amplitude may be chosen at design time. If the amplitude of any analog signal received by an AFE stage exceeds a linear range of the gain response of the AFE stage, nonlinear amplification may result in the conditioned analog signal 320 received by the ADC 330 being compressed which causes signal distortion. The compression typically occurs at the largest (negative and positive) voltages of the signal, namely, the outer eye portion of the signal. Due to chip process, power supply voltage, and temperature (PVT) differences, the compression may be significant.

Thus, alternatively, the ACDGC block 305 may control a set gain 325 sent to the AFE stages 310, and measure amplitudes of each of the inner and outer portions of a signal eye of the conditioned analog signal 320 at different set gains 310. The ACDGC block 305 may calculate a gain compression ratio by comparing a change in the inner eye amplitude (which does not experience compression) at different set gains 325 with a change in the outer eye amplitude (which may experience compression at a higher gain) at the different set gains 325. The ACDGC block 305 may control the gain control signal 325 based on the calculated compression ratio, for example so as to maintain the compression ratio at or below a threshold value.

ACDGC Operation

Figure 4:
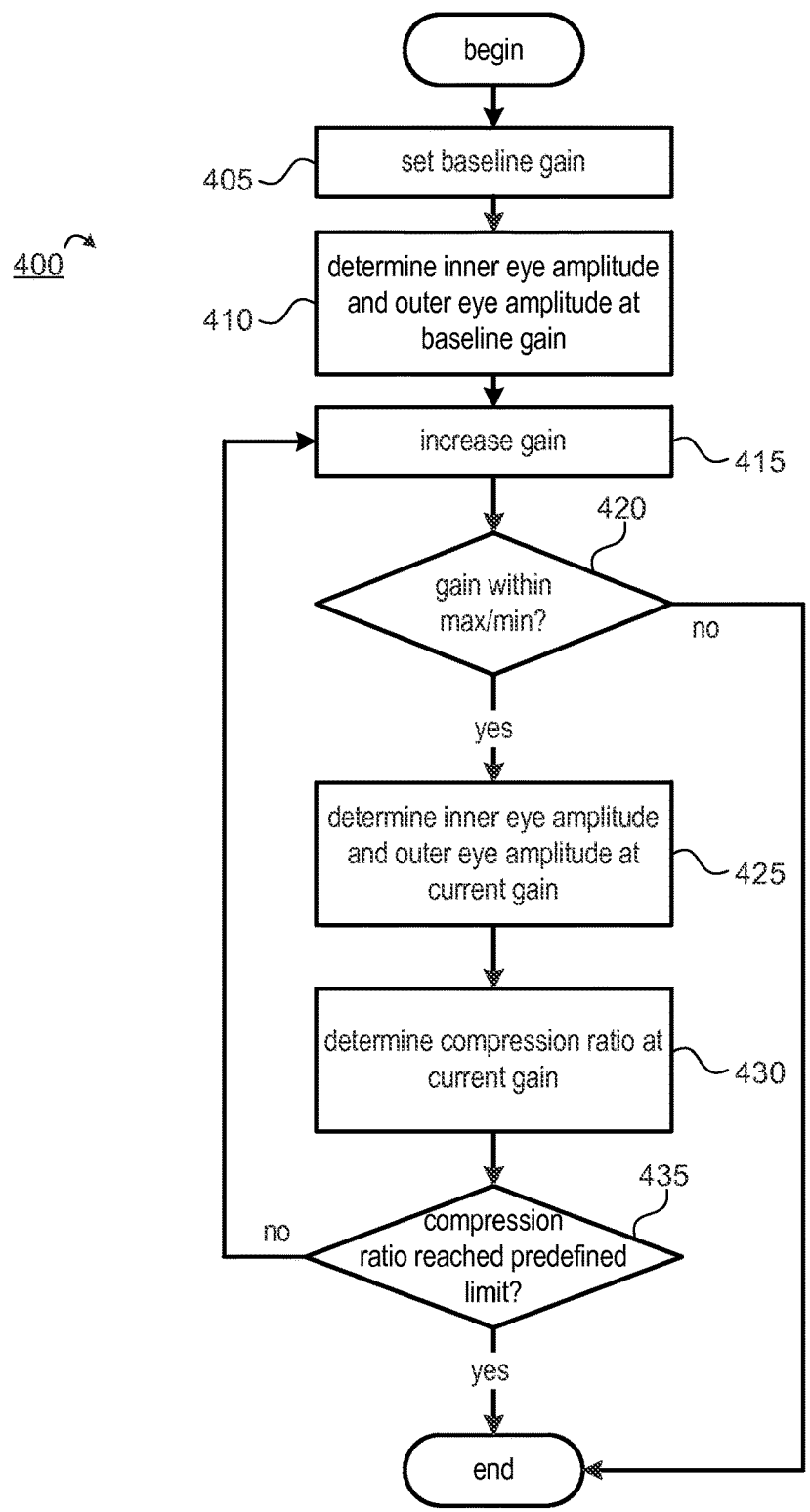
FIG. 4 is a flowchart illustrating a method of operating the AFE circuit of FIG. 3.

A method 400 of controlling a gain of an AFE circuit 300 using the ACDGC block 305 is now described with reference to FIGS. 4-6.

The ACDGC block 305 outputs a gain control signal 325 to set a baseline set gain $g_1$ to the AFE $g_1g_1$ stages 310 (step 405). The ACDGC block 305 then receives from the last AFE stage 310 the conditioned analog signal 320 and determines an amplitude of the inner eye, which may be a median inner eye amplitude $A_i(g_1)$, and similarly an outer eye amplitude, which may be a median outer eye amplitude $A_o(g_1)$ of the conditioned analog signal 320 at the baseline set gain $g_1$ (step 410). FIG. 5 shows an example conditioned analog signal 500 at a baseline set gain $g_1$. As shown, the baseline set gain $g_1$ may be selected such that the median inner eye amplitude $A_i(g_1)$ 505 falls within a non-compressed, linear region 510 of the gain response 515 of the AFE stages 310. Similarly, the baseline set gain $g_1$ may also be set such that the median outer eye amplitude $A_o(g_1)$ 520 falls within the non-compressed, linear region 510 of the gain response 515 of the AFE stages 310.

The ACDGC block 305 may then increase the set gain 325 to a current set gain $g_m$ (step 415). The increase may be a predefined increment in the set gain 325. Optionally, if the current set gain $g_m$ is determined to be equal to or less than a minimum set gain, or is equal to or greater than a maximum set gain—or, in other words, if the current set gain $g_m$ is determined not the be within predefined minimum and maximum values (decision 420)—then the method ends. Otherwise, the ACDGC block 305 determines a median inner eye amplitude $A_i(g_m)$ and a median outer eye amplitude $A_o(g_m)$ at the current set gain $g_m$ (step 425). FIG. 6 shows an example conditioned analog signal 600 at a current set gain $g_m$. As shown the current set gain $g_m$ may be selected such that the median inner eye amplitude $A_i(g_m)$ 605 continues to fall within the non-compressed, linear region 510 of the gain response 515 of the AFE stages 310. At some threshold value of the current set gain $g_m$, however, the median outer eye amplitude $A_o(g_m)$ 610 will fall outside of the non-compressed, linear region 510, or in other words within a compressed, nonlinear region 615 of the gain response 515 of the AFE stages 310.

The ACDGC block 305 may then determine a compression ratio at the current set gain $g_m$ (step 430) based on the median inner eye amplitude $A_i(g_m)$ and median outer eye amplitude $A_o(g_m)$ at the current set gain $g_m$, and the median inner eye amplitude $A_i(g_1)$ and the median outer eye amplitude $A_o(g_1)$ at the baseline set gain $g_1$. One method of determining the compression ratio is to estimate the theoretical gain response of the AFE stages in the absence of compression based on the change of the median inner eye amplitude between the baseline set gain $g_1$ and the current set gain $g_m$, by calculating:

$$k_i = \frac{A_i(g_m)}{A_i(g_1)} \quad (1)$$

Figure 6:
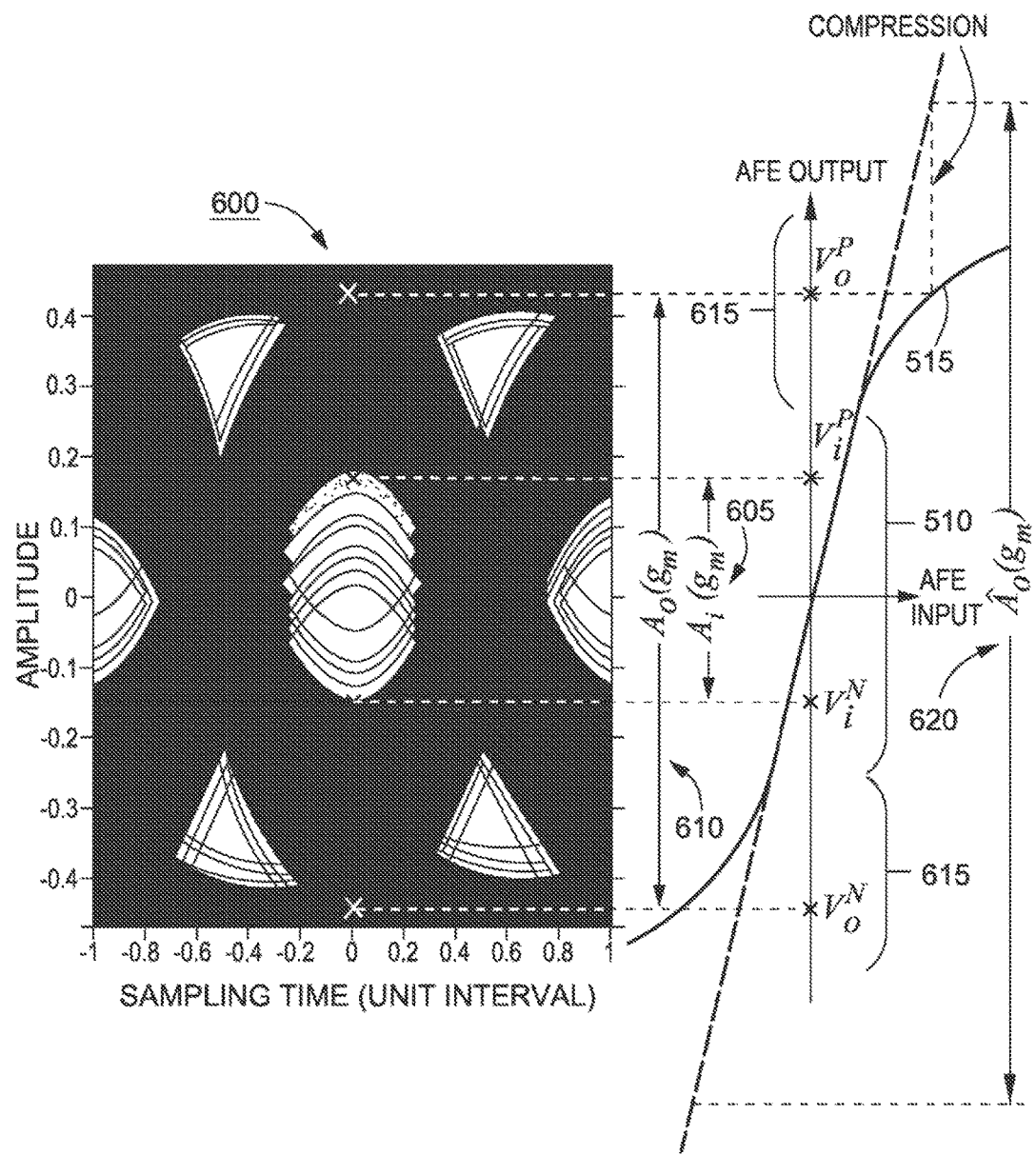
FIG. 6 is a chart illustrating a determination of inner and outer signal eye amplitudes at a current set gain with gain compression of the outer signal eye.

As shown in FIG. 6, an estimate of the outer eye amplitude at the current set gain $g_m$ without compression $\hat{A}_o(g_m)$ 620 may then be calculated by:

$$\hat{A}_o(g_m) = k_i A_o(g_1) \quad (2)$$

The compression ratio $c(g_m)$ at the current set gain $g_m$ may then be calculated as the ratio between the estimate of the outer eye amplitude $\hat{A}_o(g_m)$ and the median outer eye amplitude $A_o(g_m)$ at the current set gain $g_m$:

$$c(g_m) = \frac{\hat{A}_o(g_m)}{A_o(g_m)} = \frac{k_i A_o(g_1)}{A_o(g_m)} = \frac{A_i(g_m)}{A_i(g_1)} \bigg/ \frac{A_o(g_m)}{A_o(g_1)} \quad (3)$$

The ACDGC block 305 then determines whether the compression ratio $c(g_m)$ at the current set gain $g_m$ has reached a predefined limit $c_{max}$ (decision 435), in which case the method ends. Otherwise, if the compression ratio $c(g_m)$ has not yet reached the predefined limit, that is $c(g_m) \leq c_{max}$, then the ACDGC block 305 increases the current set gain $g_m$, which increase may be by a predefined increment in the set gain, method steps 415 to 435 repeat.

In this way, the ACDGC block 305, beginning at a baseline set gain $g_1$ with no gain compression, incrementally increases the current set gain $g_m$ until a predefined compression ratio limit $c_{max}$ is reached. The predefined compression ratio limit $c_{max}$ may be a design parameter, and may be selected based on a predetermined tolerable level of gain compression, which may be determined with reference to any suitable standard such as an error rate of ADC block 330 or otherwise.

Specific Embodiment

Figure 7:
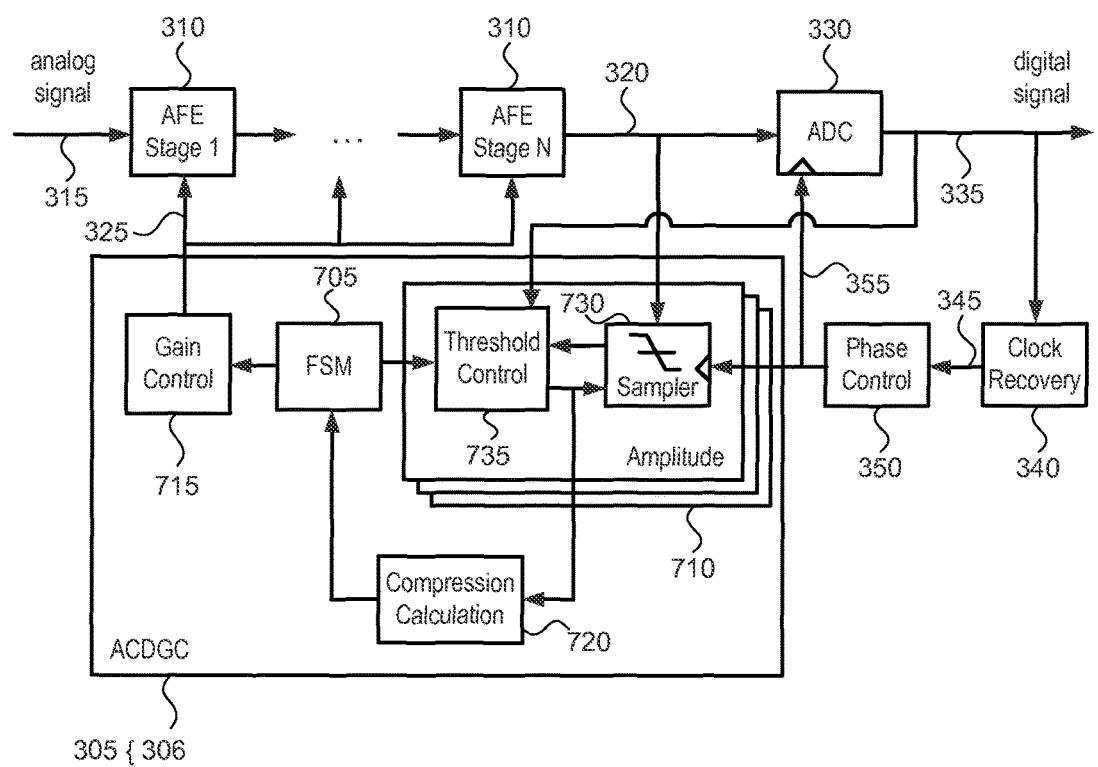
FIG. 7 is a block diagram of a specific embodiment of the AFE circuit of FIG. 3.

The ACDGC block 305 may be implemented in any suitable embodiment to perform the functionality described herein. With reference to FIG. 7, AFE circuit 301 is a specific instance of AFE circuit 300, and has an ACDGC block 306 which is a specific instance of the ACDGC block 305 is now described with reference to FIGS. 7-12 by way of example only and without limitation to other possible embodiments and implementations.

FIG. 7 shows the AFE circuit 301 with an ACDGC block 306 including a finite state machine (FSM) block 705, one or more amplitude blocks 710, a gain control block 715, and a compression calculation block 720. The FSM block 705 controls the gain control block 715 and the amplitude block(s) 710 to measure the amplitudes of each of the inner and outer portions of the signal eye of the conditioned analog signal 320 at the different set gains. The compression calculation block 720 receives the measured amplitudes 725 from the amplitude block(s) 710 and calculates the gain compression ratio as described above. The FSM block 705 controls the gain control block 715 based on the calculated compression ratio to control the set gain included in the gain control signal 325 output to the AFE stages 310. The set gain may be limited so as to maintain the compression ratio at or below a threshold value.

Amplitude Block

The ACDGC block 306 may include one or more amplitude blocks 710 to measure median positive and negative voltages of the amplitude of the inner and outer eyes of the conditioned analog signal 320 at a given set gain.

Figure 5:
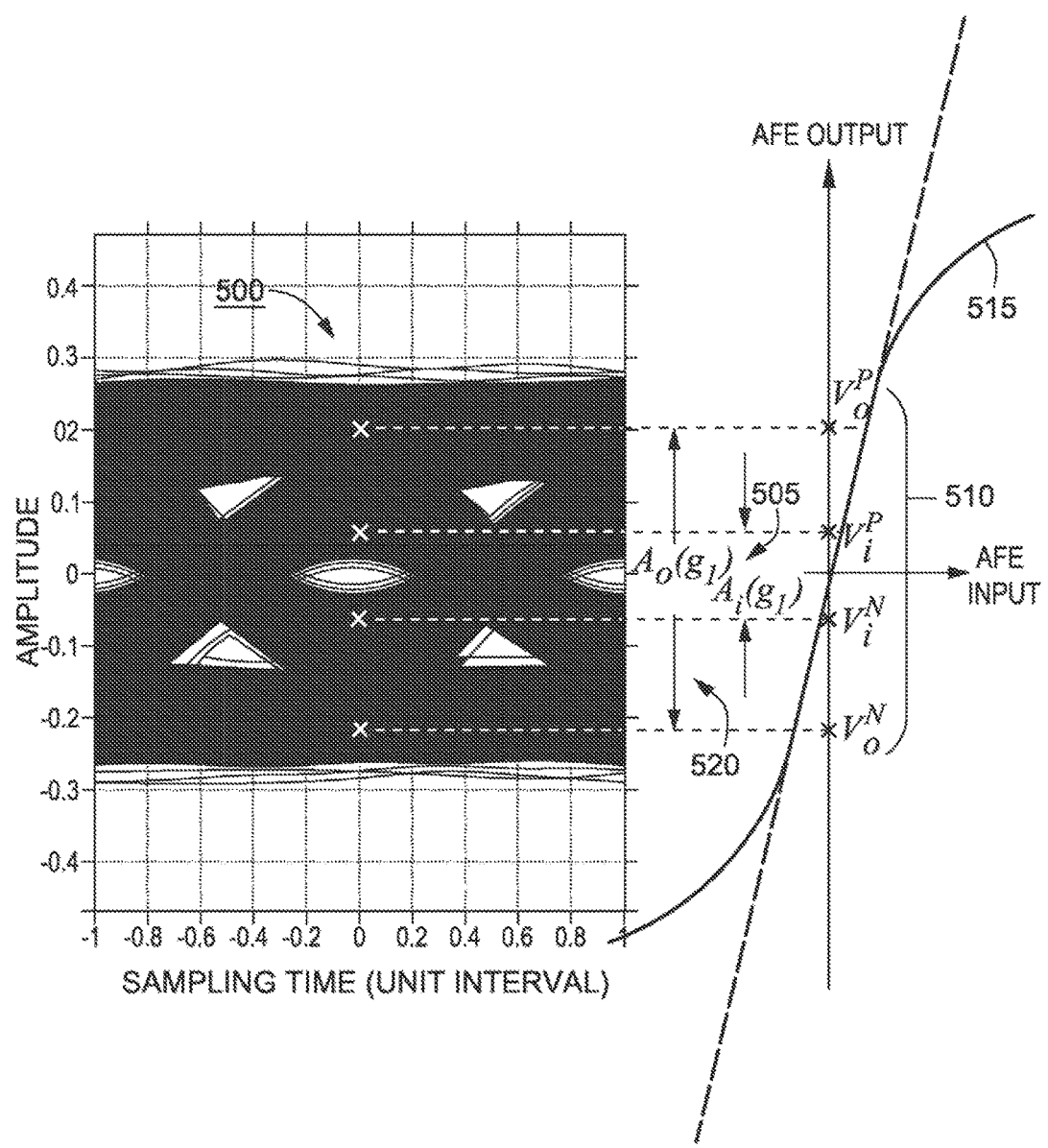
FIG. 5 is a chart illustrating a determination of inner and outer signal eye amplitudes at a baseline set gain without gain compression.

In other words, and with reference to FIGS. 5 & 6, the amplitude block(s) measure: $V_i^P$ and $V_i^N$, the median positive and negative voltages, respectively, of the amplitude of the inner signal eye of the conditioned analog signal 320; and, $V_o^P$ and $V_o^N$, the median positive and negative voltages, respectively, of the amplitude of the outer signal eye of the conditioned analog signal 320.

In one alternative, the ACDGC block 306 may have a single amplitude block 710 controlled by the FSM bock 705 to determine alternatively, one at a time and in any desired order, the median positive and negative voltages of the respective amplitudes of the inner and outer signal eyes of the conditioned analog signal 320, or in other words to determine each one of $V_i^P$, $V_i^N$, $V_o^P$, and $V_o^N$ at a time in turn and in any desired order. The single amplitude block 710 may output sequentially to the compression calculation block 720 the voltages thus alternatively determined.

Alternatively, the ACDGC block 306 may have a plurality of amplitude blocks 710, each amplitude block 710 determining a different one of voltages $V_i^P$, $V_i^N$, $V_o^P$, and $V_o^N$ and at a given time. For example, the ACDGC block 306 may have four amplitude blocks, 710 each one determining a corresponding different one of $V_i^P$, $V_i^N$, $V_o^P$, and $V_o^N$. In this way, the four voltages characterizing the median amplitudes of the inner and outer signal eyes of the conditioned analog signal 320 may be determined simultaneously and output to the compression calculation block 720, which may be configured to receive all of the voltages at once.

Each amplitude block 710 may include a sampler block 730 and a threshold control block 735 which cooperate to determine and output to the compression calculation block 720 one of voltages $V_i^P$, $V_i^N$, $V_o^P$, and $V_o^N$ given a target count and a calculated period received from the FSM block 705.

Each sampler block 730 may be a single bit sampler (or slicer) with a programmable threshold voltage controlled by the threshold control block 735 to measure a preconfigured median voltage.

For example, to detect the inner and outer portions of the signal eye, a threshold voltage 725 received by the sampler block 730 may be positive or negative, and may be varied by the threshold control block 735 until a certain proportion of the samples, as specified by the FSM block 705, are above (for positive voltages) or below (for negative voltages) the threshold voltage in a given time window. Different target proportions may be set corresponding to the inner and outer portions of the signal eye. In each case, when a current threshold voltage generates the target proportion of samples, the threshold voltage indicates the median positive voltage (for positive voltages) or median negative voltage (for negative voltages) of the amplitude of the inner or outer portion of the signal eye, as the case may be.

For example, for the inner eye of the conditioned analog signal, the threshold voltages may be determined so as to find median positive and negative voltages $V_i^P$ and $V_i^N$ such that the proportion p of voltages V at baseline set gain $g_1$ is given by:

$$p(V>V_i^P|g=g_1)=p_i$$

$$p(V<V_i^N|g=g_1)=p_i$$

Similarly, for the outer eye of the conditioned analog signal, the threshold voltages may be determined so as to find median positive and negative voltages $V_o^P$ and $V_o^N$ such that the proportion p of voltages V at baseline set gain $g_1$ is given by:

$$p(V>V_o^P|g=g_1)=p_o$$

$$p(V<V_o^N|g=g_1)=p_o$$

And further similarly, the corresponding median voltages at the current set gain $g_m$ may be given by:

$$p(V>V_i^P|g=g_m)=p_i$$

$$p(V<V_i^N|g=g_m)=p_i$$

$$p(V>V_o^P|g=g_m)=p_o$$

$$p(V<V_o^N|g=g_m)=p_o$$

For the detection of inner eye amplitude, the target proportion $p_i$ of samples above the positive threshold voltage $V_i^P$, or below the negative threshold voltage $V_i^N$, may be chosen in the range of 35% to 45% in order to have an inner portion of signal eye without compression. For the detection of outer eye amplitude, the target proportion $p_o$ of samples above the positive threshold voltage $V_o^P$, or below the negative threshold voltage $V_o^N$, may be chosen in the range of 3% to 10% in order to have good sensitivity to gain compression without requiring a long period of detection window. The foregoing ranges are presented by way of non-limiting example only, and other ranges are possible.

Figure 8:
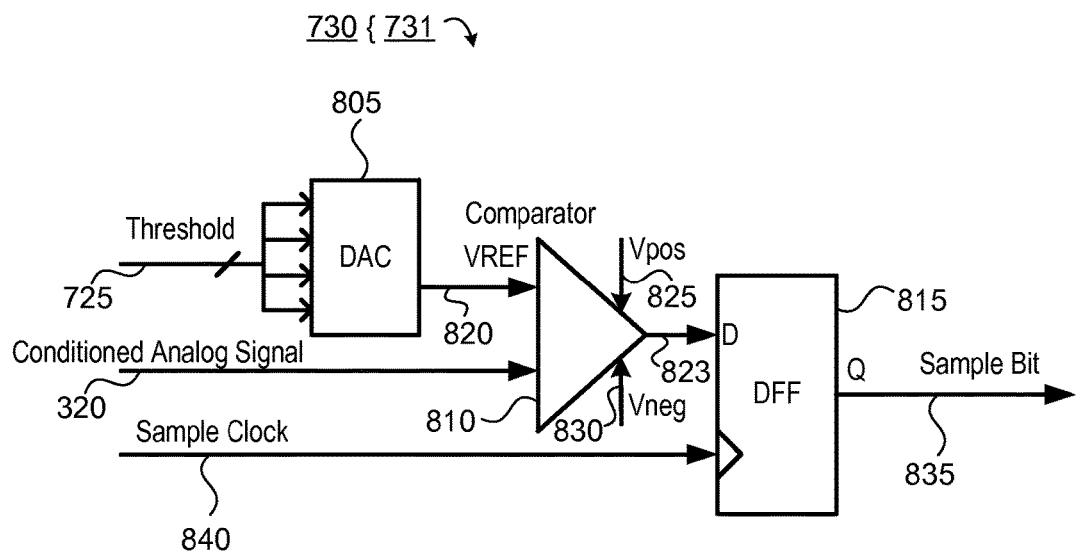
FIG. 8 is a block diagram of a sampler block of an amplitude block of the ACDGC block of the embodiment of FIG. 7, configured to determine median positive voltages.
Figure 9:
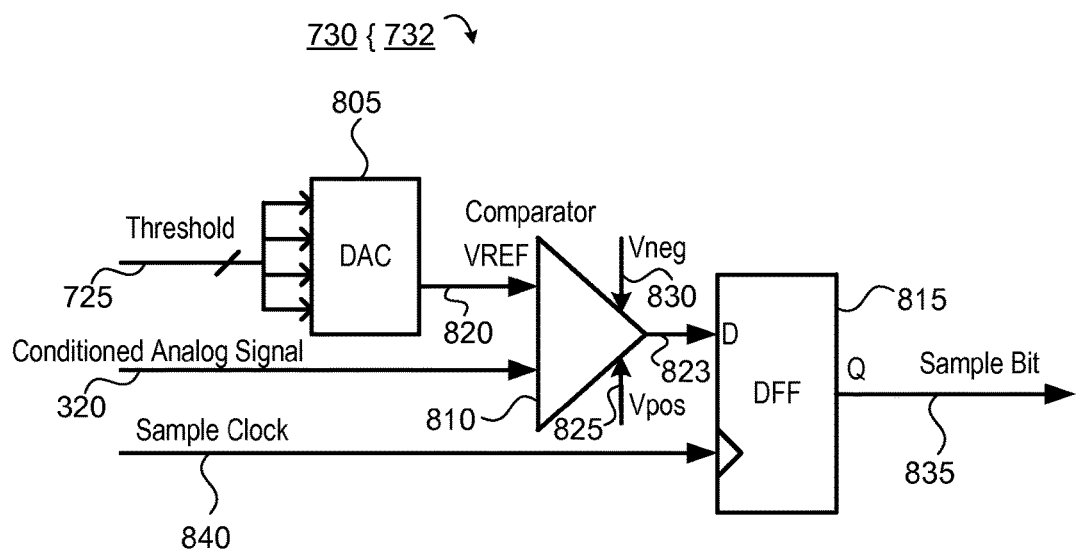
FIG. 9 is a block diagram of a sampler block of an amplitude block of the ACDGC block of the embodiment of FIG. 7, configured to determine median negative voltages.
Figure 10:
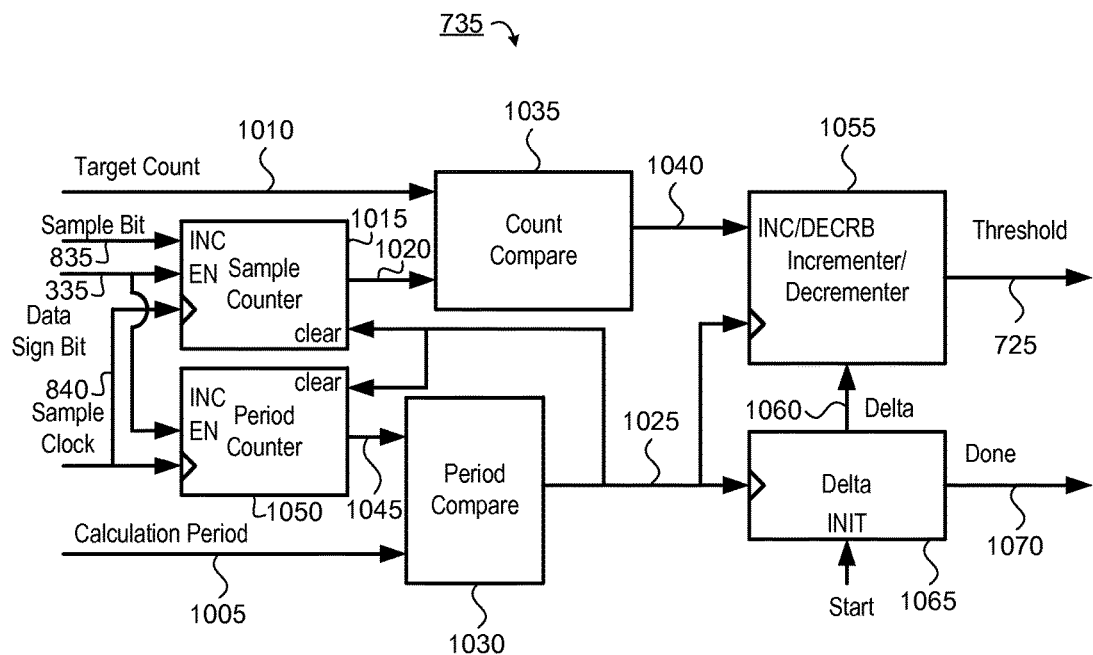
FIG. 10 is a block diagram of a threshold block of an amplitude block of the ACDGC block of the embodiment of FIG. 7.

FIGS. 8-10 show embodiments of sampler blocks 730 and a threshold control block 735 by way of example only and without limitation to other possible embodiments and implementations.

Sampler Block

FIGS. 8 & 9 shown sampler blocks 731, 732 are instances of sampler block 730, and which are identical except in that the sampler block 731 shown in FIG. 8 is configured to sample positive voltages and the sampler block 732 shown in FIG. 9 is configured to sample negative voltages. In each case, the sampler block 730 compares the conditioned analog signal to a threshold voltage received from the threshold control block.

The sampler block 730 includes a digital-to-analog converter (DAC) 805, a comparator block 810, and a D flip-flop (IFF) 815. The threshold control block 735 sends a digitally encoded threshold voltage 725 to the sampler block 730. This multi-bit threshold voltage 725 is converted to an analog reference voltage (VREF) 820 by the DAC 805, which is received by the comparator block 810. The comparator block 810 compares the input conditioned analog signal 320 to the analog reference voltage VREF 820. The threshold voltage 725 may encode both positive and negative values, and for example may be a 4-bit, two complement number, although other configurations are possible, If the sampler block 730 is the sampler block 731 which is sampling for a positive threshold voltage, such as a median positive voltage of the amplitude of the inner or outer signal eye, and the conditioned analog signal voltage is greater than the analog reference voltage VREF, then the output 823 of the comparator block 810 will be the maximum supply voltage Vpos 825, and otherwise it will be the negative supply voltage Vneg 830. Alternatively, if the sampler block 730 is the sampler block 732 which is sampling for a negative threshold voltage, such as a median negative voltage of the amplitude of the inner or outer signal eye, then either the inputs or supply voltages of the comparator block 810 in FIG. 8 may be reversed, for example as shown in FIG. 9; in this case, if the conditioned analog signal 320 voltage is less than the analog reference voltage VREF 820, then the output 823 of the comparator block will be the positive supply voltage Vpos 825, and otherwise it will be the negative supply voltage Vneg 823. A range of the analog reference voltage VREF 820 may be configured to span the positive supply voltage Vpos 825 and the negative supply voltage Vneg 823.

In either case, the output 823 of the comparator block is sampled by the DFF 815. The DFF 815 will output a sample bit 835 of '1' if the output 823 received from the comparator block 810 is above the midpoint of the supply voltages 825, 830, and will output a sample bit 835 of '0' if the comparator block 810 output 823 is below the midpoint of the supply voltages 825, 830. The output of the DFF 815 only changes when the sample clock 840 input changes from a Vneg to Vpos voltage.

The sampling is repeated over many sampling clocks in order to provide statistics on the voltage of the conditioned analog signal. The timing of the sampling is done such that the measurement of the signal occurs in the middle of the signal eye. The sampling rate can be less than or equal to the bit rate of the received signal.

Threshold Control Block

The threshold control block 735 generates a digitally encoded threshold voltage 725 given an input calculation period 1005 and target count 1010 received from the FSM block 705. An embodiment of a threshold control block 735 is shown in FIG. 10.

A sample bit 835 from the sampler block 730 is received by a sample counter 1015. A sample counter value 1020 is initially set to zero and increments by one at every rising edge of the sample clock 840 when the sample bit 835 is a '1', or remains at a current value if the sample bit 835 is a '0'. The sample counter value 1020 is cleared to zero by a clear signal 1025 from a period compare block 1030.

The sample counter value 1020 is received by a count compare block 1035 which compares a target count 1010 received from the FSM block 705 to the sample counter value 1020. The output 1040 of the count compare block 1035 is a '1' when the sample counter value 1020 is greater than the target count 1010 and '0' otherwise.

A period counter value 1045 of a period counter block 1050 starts at zero and increments by one at every rising edge of the sample clock 840. The period counter value 1045 is received by the period compare block 1030. The period counter value 1045 is cleared to zero by a clear signal 1025 from the period compare block 1030.

The period compare block 1030 compares a calculation period 1005 received from the FSM block 705 to the period counter value 1045 received from the period counter block 1050. The period compare block 1030 generates at its output a period compare value 1025 of '0' when the period counter value 1045 is less than the calculation period 1005 and a '1' when the period counter value 1045 is greater than or equal to the calculation period 1005.

A threshold voltage 725 generated by an incrementer/decrementer block 1055 is initially set to one-half of a maximum value of a maximum threshold voltage. The threshold voltage 725 is updated on a rising edge of the period compare value 1025 output from the period compare block 1030, which occurs once every calculation period clock cycles. During the update the threshold voltage 725 is increased or decreased by a current delta value 1060 if a count compare value 1040 input from the count compare block 1035 is '1' or decremented by the current delta value 1060 if the count compare value 1040 is '0'. Specifically, the threshold voltage 725 is increased by the current delta value 1060 if a positive voltage threshold is being determined, e.g. a median positive voltage of the inner or outer eye amplitude; alternatively, the threshold voltage 725 is decreased by the current delta value 1060 (or the delta value 1060 is negative) if a negative voltage threshold is being determined, e.g. a median negative voltage of the inner or outer eye amplitude. A delta block 1065 determines delta value 1060, that is, by how much the output threshold voltage 725 will be changed when the calculation period is reached. The delta value 1060 is initially set to one-half of the maximum range of the threshold. The delta value 1060 is reduced by one-half of its previous value when the calculation period is reached. The done signal 1070 is set to '1' when the delta value 1060 has been reduced to the value 1.

As noted above, the threshold incrementer/decrementer block 1055 controls the threshold voltage 725. The threshold voltage 725 is initially set to one-half of an absolute maximum value. Every time the calculation period 1005 is reached the threshold voltage 725 is incremented by the input delta value 1060 if the count compare value 1040 is a '1', or decremented by the input delta value 1060 if the count compare value 1040 is a '0'.

As noted above, a single amplitude block 710 may be used alternatively to determine the respective median positive and negative voltages of the inner and outer signal eyes sequentially, and thus configured alternatively depending on whether a positive or a negative threshold voltage is being determined. Alternatively, a number, such as four, amplitude blocks 710 may be used simultaneously to determine all four median voltages simultaneously, and in this case the four corresponding threshold control blocks 735 receive from the FSM block 705 corresponding target counts, and each controls its incrementer/decrementer block 1055 as described above depending on whether the threshold control block 735 determines a positive or negative threshold voltage. Each threshold control block 735 may receive the outgoing digital signal 335 from the ADC 330, as shown in FIG. 7, and in particular the data sign bit of the digital signal 335 which indicates whether a positive or negative threshold voltage is being determined. The sign bit may be received by and enable or disable each of the sample counter 1015 and period counter 1050.

Compression Calculation Block

Figure 11:
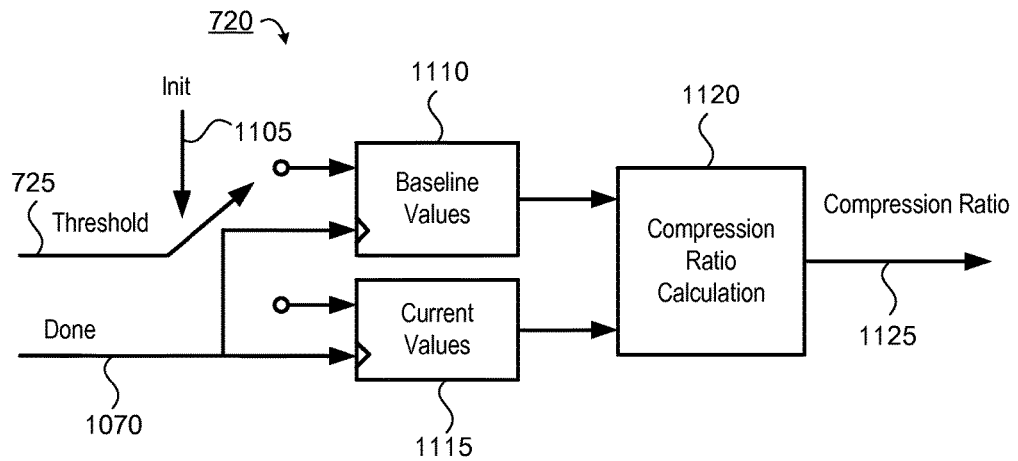
FIG. 11 is a block diagram of a compression calculation block of the ACDGC block of the embodiment of FIG. 7.

The compression calculation block 720 computes the compression ratio of the conditioned analog signal 320 at a current set gain $g_m$. An embodiment of a compression calculation block 720 is shown in FIG. 11.

The compression calculation block 720 receives the threshold voltages 725 from the threshold control block 735, and saves them into registers on a rising edge of a done signal 1070 received from the threshold control block 735. An initialization signal 1105 switches the threshold voltage 725 input from a baseline values register 1110 (or registers) to a current values register 1115 (or registers). Thus, when the median amplitude voltages $V_i^P$, $V_i^N$, $V_o^P$, and $V_o^N$ are determined at the baseline set gain $g_1$, they are stored in the baseline values register 1110. Subsequently, when the median amplitude voltages $V_i^P$, $V_i^N$, $V_o^P$, and $V_o^N$ are determined at a current set gain $g_m$, they are stored in the current values register 1115.

As indicated above, if the ACDGC block 306 has a single amplitude block 710 which determines the median amplitude voltages sequentially, the compression calculation block 720 may receive and store them sequentially, and in this case the compression calculation block 720 may further include one or more buffers to hold the median amplitude voltages until all of them are determined and received. Alternatively, if the ACDGC block 306 has multiple amplitude blocks 710 which determine different median amplitude voltages simultaneously, the compression calculation block 720 receives and stores them simultaneously.

The compression calculation block 720 has a compression ratio calculation block 1120 to calculate the compression ratio $c(g_m)$ at the current set gain $g_m$ as described above, based on the median inner eye amplitude $A_i(g_1)$ and median outer eye amplitude $A_o(g_1)$ at the baseline set gain $g_1$, and median inner eye amplitude $A_i(g_m)$ and a median outer eye amplitude $A_o(g_m)$ at the current set gain $g_m$.

Specifically, the compression ratio calculation block 1120 calculates the median inner eye amplitudes $A_i$ and outer eye amplitudes $A_o$ at the baseline set gain $g_1$ and the current set gain $g_m$ based on the positive median amplitude voltage $V_i^P$ and the negative median amplitude voltage $V_i^N$ at the baseline set gain $g_1$ and the current set gain $g_m$, as follows:

$$A_i(g_1) = V_i^P(g_1) - V_i^N(g_1)$$

$$A_o(g_1) = V_o^P(g_1) - V_o^N(g_1)$$

$$A_i(g_m) = V_i^P(g_m) - V_i^N(g_m)$$

$$A_o(g_m) = V_o^P(g_m) - V_o^N(g_m)$$

The compression ratio calculation bock 1120 then calculates the compression ratio $c(g_m)$ at current set gain $g_m$ based on $A_i(g_1)$, $A_o(g_1)$, $A_i(g_m)$, and $A_o(g_m)$, as set forth in equations (x) to (y), above. An output of the compression ratio calculation block 1120 is the compression ratio $c(g_m)$ 1125. The compression ratio $c(g_m)$ 1125 may be valid only after the baseline values register 1110 and current values register 1115 have at least once received all of the above median amplitude voltages. The compression ratio $c(g_m)$ 1125 is sent to the FSM block 705.

Gain Control Block

Figure 12:
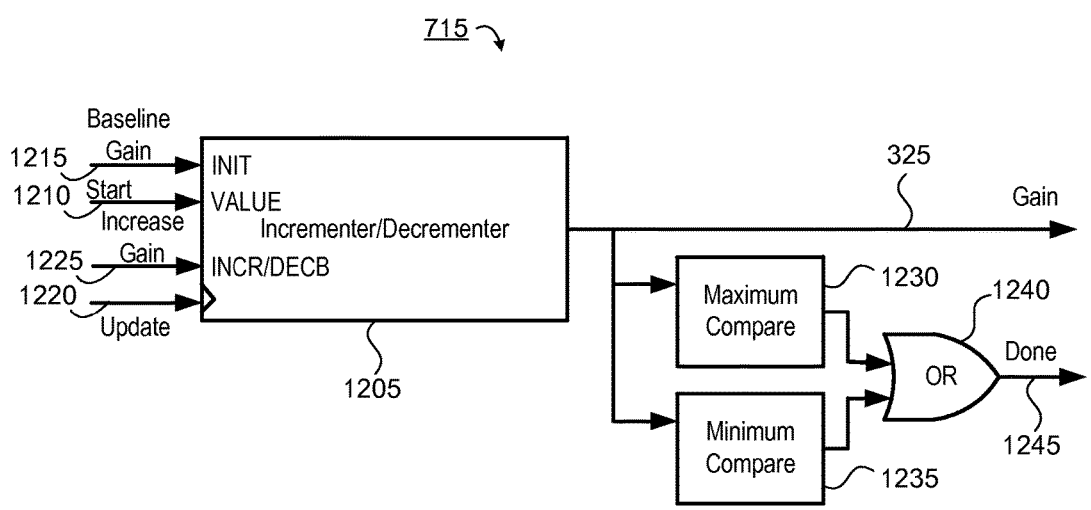
FIG. 12 is a block diagram of a gain control block of the ACDGC block of the embodiment of FIG. 7.

The gain control block 715 is used to control the set gains of the AFE stages 310 under the control of the FSM block 705. An embodiment of a gain control block 715 is shown in FIG. 12.

An incrementer/decrementer block 1205 receives from the FSM block 705 a start signal 1210. When the start signal 1210 is received the set gain 325 is set to the baseline set gain value 1215 received from the FSM block 705.

An update signal 1220 is received from the FSM block 705. At each rising edge of the update signal 1220 the incrementer/decrementer block 1205 increases the current set gain 325 by a preconfigured value if an increase gain signal 1225 from the FSM block 705 is a '1', or decreases the set gain 325 by the preconfigured value otherwise.

A maximum compare bock 1230 outputs a '1' if the set gain 325 from the incrementer/decrementer block 1205 is equal to or greater than a preconfigured maximum gain for the system and outputs a '0' otherwise. A minimum compare block 1235 outputs a '1' if the set gain 325 is equal to or less than a preconfigured minimum gain specified for the system and outputs a '0' otherwise. An OR gate 1240 receives the outputs of the maximum compare block 1230 and minimum compare block 1235 and outputs 1245 a logic OR of these inputs—that is, the OR gate outputs a '1' if the gain is equal to greater than the maximum gain, or is equal to or less than the minimum gain, and outputs a '0' otherwise. This done signal is output to a controlling or cooperating system as an indication that the ACDGC block 305 has finished setting the optimum gain.

Finite State Machine (FSM) Block

The finite state machine (FSM) 705 block controls the threshold control block 735 of each amplitude block 710, and the gain control block 715, and interprets the current compression ratio $c(g_m)$ at current set gain $g_m$ received from the compression calculation block 720. The FSM block 705 selects a baseline set gain $g_1$ wherein no compression occurs in the conditioned analog signal 320.

The FSM block's 705 operation depends upon whether the ACDGC block 306 has only one amplitude block 710, or instead has multiple amplitude blocks 710.

In either case, the FSM block 705 starts by signaling the gain control block 715 to set its output values to nominal starting values. As such, the gain control block 715 is controlled to set the set gain 325 of the AFE stages 310 to baseline set gain $g_1$. In addition, the FSM block 705 signals the threshold control block 735 in the case of a single amplitude block 710, or threshold control blocks 735 in the case of multiple amplitude blocks 710, to nominal starting values. As such, the FSM block 705 gives each threshold control block 735 a corresponding target count and calculation period.

in the case of multiple amplitude blocks 710, for example four amplitude blocks 710 each configured to determine a different one of voltages $V_i^P$, $V_i^N$, $V_o^P$, and $V_o^N$, once each amplitude block 710 determines and outputs to the compression calculation block 720 its corresponding threshold voltage 725, the FSM block 705 then signals the gain control block 715 to increase the set gain 325 to a new current set gain $g_m$, and signals the threshold control blocks 735 of the amplitude blocks 710 to compute new threshold voltages.

In the case of a single amplitude block 710, after a first threshold voltage V—that is, one of voltages $V_i^P$, $V_i^N$, $V_o^P$, and $V_o^N$—is reached by the threshold control block 735, the compression calculation block 720 receives and stores the threshold voltage, and the FSM block 705 then signals the threshold control block 735 to determine another one of the threshold voltages, until all of the threshold voltages are determined. The FSM block 705 then signals the gain control block 715 to increase the set gain 325 to a new current set gain $g_m$, and as above signals the threshold control block 735 in sequence to determine the voltage thresholds.

After all of the voltage thresholds $V_i^P$, $V_i^N$, $V_o^P$, and $V_o^N$ are determined at both the baseline set gain $g_1$ and the current set gain $g_m$, the compression calculation block 720 computes the compression ratio and sends it to the FSM block 705. If the compression ratio $c(g_m)$ at the current set gain $g_m$ is below the predefined limit $c(g_m) \leq c_{max}$, the FSM block 705 signals to the gain control block 715 to increase the current set gain $g_m$ 325. The FSM block 705 then again signals the one or more amplitude blocks 710 to determine the median amplitudes $V_i^P$, $V_i^N$, $V_o^P$, and $V_o^N$ at the new current set gain $g_m$, for output to the compression calculation block 720, and the process repeats until the compression ratio $c(g_m)$ reaches the predefined limit $c_{max}$.

Advantages

By having accurate detection of the gain compression there is no need to be conservative to choose a low gain in order to keep compression within the linear gain response region. Automatic compression detection in combination with gain control supports incoming signals with larger dynamic range without sacrificing system performance due to non-optimum gain selection.

By having knowledge of the gain compression, the amplifier design constraints can be relaxed which improves power consumption and simplifies the amplifier design.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

What is claimed:

1. A method comprising:
setting a gain applied in a circuit to a baseline set gain;
determining a first baseline parameter associated with a first feature of a particular pattern of a signal at said baseline set gain, and a second baseline parameter associated with a second feature of said particular pattern of said signal at said baseline set gain;
setting said gain to a current set gain that is different than said baseline set gain;
determining a gain compression ratio based on one or more of said first baseline parameter, said second baseline parameter, a first current parameter associated with said first feature of said particular pattern at said current set gain, and a second current parameter associated with said second feature of said particular pattern at said current set gain; and
adjusting said current set gain until said gain compression ratio reaches a predefined limit.

2. The method according to claim 1, wherein determining each one of said first baseline parameter, said second baseline parameter, said first current parameter, and said second current parameter comprises:
determining each of a corresponding positive voltage and a corresponding negative voltage by adjusting a corresponding threshold voltage until a proportion of samples of said signal in a sampling period exceeding said threshold voltage reaches a target proportion.

3. The method according to claim 2, wherein a target proportion for each parameter associated with said first feature is different than a target proportion for a parameter associated with said second feature.

4. The method according to claim 1, wherein each one of said first baseline parameter, said second baseline parameter, said first current parameter, and said second current parameter comprises is a median value.

5. The method according to claim 1, wherein determining said gain compression ratio comprises:
determining a compression-free estimate of said second current parameter without gain compression; and
determining said gain compression ratio based on said compression-free estimate and said second current parameter.

6. The method according to claim 5, wherein said gain compression ratio is a quotient of said compression-free estimate of said second current parameter without gain compression and said second current parameter.

7. The method according to claim 5, wherein determining said compression-free estimate of said second current parameter comprises:
determining a compression-free gain response based on said first current parameter and said first baseline parameter; and
determining said compression-free estimate of said second current parameter based on said compression-free gain response and said second baseline parameter.

8. The method according to claim 7, wherein said compression-free gain response is a quotient of said first current parameter and said first baseline parameter.

9. The method according to claim 7, wherein said compression-free estimate of said second current parameter is a product of said compression-free gain response and said second baseline parameter.

10. The method according to claim 1 comprising selecting said set baseline gain to produce said first baseline parameter and said second baseline parameter below a nonlinear gain threshold of said circuit.

11. A system comprising:
a processing circuit operable to process analog signals; and
a gain control circuit operable to control a gain applied in said processing circuit; wherein said gain control circuit comprises:
a first control circuit operable to set said gain to a baseline set gain or a current set gain that is different than said baseline set gain;
a second control circuit operable to determine:
a first feature parameter associated with a first feature of a particular pattern of an intermediate signal that is generated by said processing circuit based on an input analog signal; and
a second feature parameter associated with a second feature of said particular pattern of said intermediate signal; and
a third control circuit operable to determine a gain compression ratio of said intermediate signal based on one or more of:
said first feature parameter at said baseline set gain,
said second feature parameter at said baseline set gain,
said first feature parameter at said current set gain, and
said second feature parameter at said current set gain.

12. The system according to claim 11, wherein said first control circuit is operable to adjust said current set gain until said gain compression ratio reaches a predefined limit.

13. The system according to claim 11, wherein said gain control circuit comprises a fourth control circuit that is operable to:
sample said intermediate signal based on a threshold voltage; and
determine, for each first feature parameter and each second feature parameter, a corresponding positive voltage and a corresponding negative voltage, by adjusting said threshold voltage until a proportion of samples of said intermediate signal in a sampling period exceeding said threshold voltage reaches a target proportion based on a target count.

14. The system according to claim 13, wherein a target proportion for said first feature parameter is different than a target proportion for said second feature parameter.

15. The system according to claim 11, wherein each of said first feature parameter and said second feature parameter is a median parameter.

16. The system according to claim 11, wherein said third control circuit is operable to determine said gain compression ratio by:
  determining a compression-free estimate of said second feature parameter at said current set gain without gain compression; and
  determining said gain compression ratio based on said compression-free estimate and said second feature parameter at said current set gain.

17. The system according to claim 16, wherein said gain compression ratio is a quotient of said compression-free estimate of said second feature parameter at said current set gain without gain compression and said second feature parameter at said current set gain.

18. The system according to claim 16, wherein said third control circuit is operable to determine said compression-free estimate of said second feature parameter at said current set gain by:
  determining a compression-free gain response based on said first feature parameter at said current set gain and said first feature parameter at said baseline set gain; and
  determining said compression-free estimate of said second feature parameter at said current set gain based on said compression-free gain response and said second feature parameter at said baseline set gain.

19. The system according to claim 18, wherein said compression-free gain response is a quotient of said first feature parameter at said current set gain and said first feature parameter at said baseline set gain.

20. The system according to claim 18, wherein said compression-free estimate of said second feature parameter at said current set gain is a product of said compression-free gain response and said second feature parameter at said baseline set gain.

* * * * *